United States Patent
Chen et al.

(10) Patent No.: US 11,619,609 B2
(45) Date of Patent: Apr. 4, 2023

(54) GATE DETECTION ROBOT BASED ON GIANT MAGNETORESISTANCE ELEMENT AND DETECTION METHOD

(71) Applicant: HOHAI UNIVERSITY, Jiangsu (CN)

(72) Inventors: Da Chen, Jiangsu (CN); Baodong Lou, Jiangsu (CN); Yingdi Liao, Jiangsu (CN); Yazhou Zhao, Jiangsu (CN); Lijun Hou, Jiangsu (CN)

(73) Assignee: HOHAI UNIVERSITY

( * ) Notice: Subject to any disclaimer, the term of this patent is extended or adjusted under 35 U.S.C. 154(b) by 245 days.

(21) Appl. No.: 17/283,242

(22) PCT Filed: Nov. 9, 2018

(86) PCT No.: PCT/CN2018/114767
§ 371 (c)(1),
(2) Date: Apr. 6, 2021

(87) PCT Pub. No.: WO2020/073407
PCT Pub. Date: Apr. 16, 2020

(65) Prior Publication Data
US 2021/0341423 A1    Nov. 4, 2021

(30) Foreign Application Priority Data
Oct. 9, 2018    (CN) .......................... 201811173150.7

(51) Int. Cl.
*G01R 33/09*    (2006.01)
*G01N 27/83*    (2006.01)
*G01S 15/08*    (2006.01)

(52) U.S. Cl.
CPC .......... *G01N 27/83* (2013.01); *G01R 33/093* (2013.01); *G01S 15/08* (2013.01)

(58) Field of Classification Search
CPC ........ G01R 33/093; G01N 27/83; G01S 15/08
See application file for complete search history.

(56) References Cited

U.S. PATENT DOCUMENTS

| 2018/0086291 A1* | 3/2018 | Valdivia Nuno | ..... E05F 15/611 |
| 2021/0048327 A1* | 2/2021 | Chen | ....................... G01S 15/08 |

* cited by examiner

*Primary Examiner* — Alesa Allgood

(57) ABSTRACT

A gate detection robot based on a giant magnetoresistance element includes a support, a guide wheel, and two driving wheels are provided at the bottom of the support. The support is provided with a controller, a range-based localization module, and a magnetic flaw detection sensor based on the giant magnetoresistance element. The magnetic flaw detection sensor includes an excitation mechanism, a giant magnetic sensor, and two magnetic concentrators. During detection, the excitation mechanism magnetizes a gate with a magnetic field as a medium. When the surface of the gate has a defect, the magnetic conductivity of the local area is reduced and the magnetic resistance is increased so that magnetic lines are distorted and diffused outside the gate to form a detectable leakage magnetic field signal, the signal is transmitted to the controller, so that the controller obtains a specific location of the detection robot.

10 Claims, 3 Drawing Sheets

GATE DETECTION ROBOT BASED ON GIANT MAGNETORESISTANCE ELEMENT AND DETECTION METHOD

FIELD

The present invention relates to the technical field of gate detection, and in particular, to a gate detection robot based on a giant magnetoresistance element and a detection method.

BACKGROUND

Gate leakage is a relatively common phenomenon in hydraulic structures. Leakage occurs in almost all gates, ranging from water gates for large reservoirs and rivers to sluice gates for small reservoirs and culverts. As a result, it is generally believed that "all gates leak", and thus people used to the gate leakage without paying sufficient attention. However, the damages and losses caused by gate leakage are far greater than most people realize, and even threaten the safety of hydraulic structures and flood control.

At present, the detection of gate leakage is still implemented by the traditional method, which combines patrol inspection with gate appearance inspection. By this method, the cause of gate leakage can basically be found, but it still has many drawbacks. For example, leakage in a water stop device located underwater is difficult to be detected, let alone the seriousness and the specific position of the leakage. And when the water leakage is found by inspectors, it is usually the case that water leakage is very serious, the water stop device is unable to stop water due to damage and have to be replaced. As a result, an extremely negative impact would be brought to the normal operation of the gate. Moreover, water leakage in a ship lock would affect the filling and discharging time of the lock chamber, prolongs the navigation time, and reduces the navigation efficiency. When the water leakage is serious and needs repair, the navigation has to be suspended for major repairs, which would affect the normal navigation and cause great economic losses. In view of the above problems, there are various detection devices, such as radiographic inspection and magnetic particle inspection. However, radiographic inspection may cause harm to human body, while magnetic particle inspection and ultrasonic flaw detection have low efficiency and pollute the environment. Moreover, existing detection devices have only one detection probe and are therefore unable to achieve high detection efficiency or accuracy.

SUMMARY

Purpose: in view of the above problems, the present invention mainly aims to provide a gate detection robot based on a giant magnetoresistance element and a detection method, thereby solving the technical problems in the prior art that gate detection robots are complex in structure, inconvenient to use and low in detection precision.

Technical solution: in order to solve the above technical problems, the technical solution adopted by the present invention is as follows.

A gate detection robot based on a giant magnetoresistance element includes an upper computer and a detection mechanism, wherein the detection mechanism includes a support; a guide wheel and two driving wheels are provided at the bottom of the support; the support is provided with a controller, a range-based localization module, and a magnetic flaw detection sensor based on the giant magnetoresistance element.

The magnetic flaw detection sensor includes an excitation mechanism, a giant magnetic sensor, and two magnetic concentrators; the excitation mechanism includes an inverted U-shaped magnetic conductive connector; two ends of the magnetic conductive connector are provided with magnetizing exciters as driving wheels, and the two magnetizing exciters form two magnetic poles of the excitation mechanism; the driving wheels are NdFeB permanent magnets; the magnetic conductive connector is fixedly connected to the upper ends of connecting brackets, and the lower ends of the connecting brackets are rotatably connected to the driving wheels; the two driving wheels are driven by a first motor; the giant magnetic sensor is located between the two magnetic concentrators.

The range-based localization module includes two ultrasonic sensors provided at the bottom of the support, and the two ultrasonic sensors are vertically provided, where one ultrasonic sensor is configured to measure the distance between the detection robot and one side of a gate, and the other ultrasonic sensor is configured to measure the distance between the detection robot and the bottom of the gate.

The first motor, the giant magnetic sensor, and the ultrasonic sensors are electrically connected to the controller; the controller and the upper computer are connected through a cable and are in serial communication.

Waterproof treatment is performed on the detection robot.

A calculation module in the controller plans a detection walking route of the detection robot, and controls the robot to perform detection according to this route; during detection, the excitation mechanism magnetizes the gate with a magnetic field as medium; when a surface of the gate has a defect, the magnetic conductivity of the local area is reduced and the magnetic resistance is increased so that magnetic lines are distorted and diffused outside the gate to form a detectable leakage magnetic field signal; the giant magnetic sensor consisting of giant magnetoresistance elements moves synchronously with the excitation mechanism, and an abnormal magnetoelectric signal is output, so that the controller obtains a specific location of the detection robot, i.e., a specific location of the defect, according to data currently measured by the two ultrasonic sensors, and transmits defect information and defect location information to the upper computer.

The magnetic flaw detection sensor based on the giant magnetoresistance element, when a gate to be detected is located on a magnetic pole side of the excitation mechanism, uses a NdFeB permanent magnet as a magnetizing exciter to magnetize said gate. If the gate has no defect, the magnetic lines pass through the gate uniformly without magnetic leakage; if a defect exists inside the gate or on the surface of the gate, magnetic leakage is generated. The magnetic concentrators collect a leakage magnetic field spatially distributed and guide it into the detection path of the giant magnetoresistance element, and the giant magnetoresistance element converts a magnetic signal into an electrical signal and transmits it to the controller.

The detection robot is convenient to operate; the measured space discrimination and the coverage range are increased; the magnetic concentrators are added, the magnetic field is collected, guided and homogenized, the detection sensitivity is high, the detection precision is high, a weak magnetic field can be measured, and the stability is good.

In a further improved embodiment, the magnetic concentrators are made of a NiFe alloy.

In a further improved embodiment, the gate detection robot further includes a clearing mechanism, and the clearing mechanism includes a shovel plate and a brush assembly, where the shovel plate is obliquely provided at the front end of the support and is configured to shovel sludge and mosses on the gate, thereby preventing the sludge and mosses from affecting the detection result.

The brush assembly includes the second motor, a rotary shaft, a rotary table, and a brush; the second motor is fixedly provided on the support; an output shaft of the second motor is connected to the rotary shaft through a coupling, and the other end of the rotary shaft is fixedly connected to the rotary table; the brush is connected to the rotary table. The controller controls the second motor to drive the rotary table to rotate, so that the brush rotates along with the rotary table to brush the surface of the gate.

In a further improved embodiment, the shovel plate is hinged to the support, the upper surface of the shovel plate is connected to one end of a spring, the lower surface of the shovel plate is connected to one end of another spring, and the other end of each of the two springs is connected to the support. In a stretched state, the springs have a buffering function.

In a further improved embodiment, the driving wheels are driven by a worm gear which comprises a worm and a gear, and the worm gear is mounted in a housing; the housing is fixed at the bottom of the support; the output shaft of the first motor is connected to a worm through a coupling; two ends of the rotating shaft of the gear extend out of the housing to be respectively connected to the corresponding driving wheels. The worm gear assembly is stable in operation and low in noise.

In a further improved embodiment, the giant magnetic sensor and the two magnetic concentrators are mounted on the housing.

In a further improved embodiment, the giant magnetic sensor is formed by combining a plurality of giant magnetoresistance elements, and the giant magnetic sensor is located between the two magnetic poles of the excitation mechanism.

A detection method of the gate detection robot based on the giant magnetoresistance element includes the following steps:

step 1. placing a robot at a vertex of an upper end of a gate to be detected at one side of the gate, measuring a distance between the robot and other side of the gate and a distance between the robot and a bottom of the gate through the two ultrasonic sensors, that is measuring a dimension of the whole gate, and sending data to the controller so that a calculation module in the controller establishes a rectangular coordinate system with the vertex as a coordinate origin, a width direction of the gate as an X-axis, and a height direction of the gate as a Y-axis;

step 2. planning, by the calculation module in the controller, a detection walking route of the detection robot, and controlling the robot to perform detection according to this route; during detection, magnetizing, by the excitation mechanism, the gate with a magnetic field as a medium; when a surface of the gate has a defect, the magnetic conductivity of the local area being reduced and the magnetic resistance being increased so that magnetic lines are distorted and diffused outside the gate to form a detectable leakage magnetic field signal; and enabling the giant magnetic sensor consisting of giant magnetoresistance elements to move synchronously with the excitation mechanism, and outputting an abnormal magnetoelectric signal, so that the controller obtains a specific location of the detection robot, i.e., a specific location of the defect, according to data currently measured by the two ultrasonic sensors, and transmits defect information and defect location information to the upper computer.

In a further improved embodiment, during the walking process of the robot along the surface of the gate, the shovel plate shovels sludge and mosses on the surface of the gate, the controller controls the second motor to drive the rotary table to rotate, so that the brush rotates along with the rotary table to brush the surface of the gate.

In a further improved embodiment, at step 2, the robot is controlled to perform detection according to a set route, and the route is set as moving upwards layer by layer along the height direction of the gate.

Compared with the prior art, the solution has the following beneficial effects.

the calculation module in the controller plans a detection walking route of the detection robot, and controls the robot to perform detection according to this route; during detection, the excitation mechanism magnetizes the gate with a magnetic field as a medium; when a surface of the gate has a defect, the magnetic conductivity of the local area is reduced and the magnetic resistance is increased so that magnetic lines are distorted and diffused outside the gate to form a detectable leakage magnetic field signal; the giant magnetic sensor consisting of giant magnetoresistance elements moves synchronously with the excitation mechanism, and an abnormal magnetoelectric signal is output, so that the controller obtains a specific location of the detection robot, i.e., a specific location of the defect, according to data currently measured by the two ultrasonic sensors, and transmits defect information and defect location information to the upper computer. The detection robot is convenient to operate; the measured space discrimination and the coverage range are increased; the magnetic concentrators are added, the magnetic field is collected, guided and homogenized, the detection sensitivity is high, the detection result precision is high, a weak magnetic field can be measured, and the stability is good.

Figure 1:
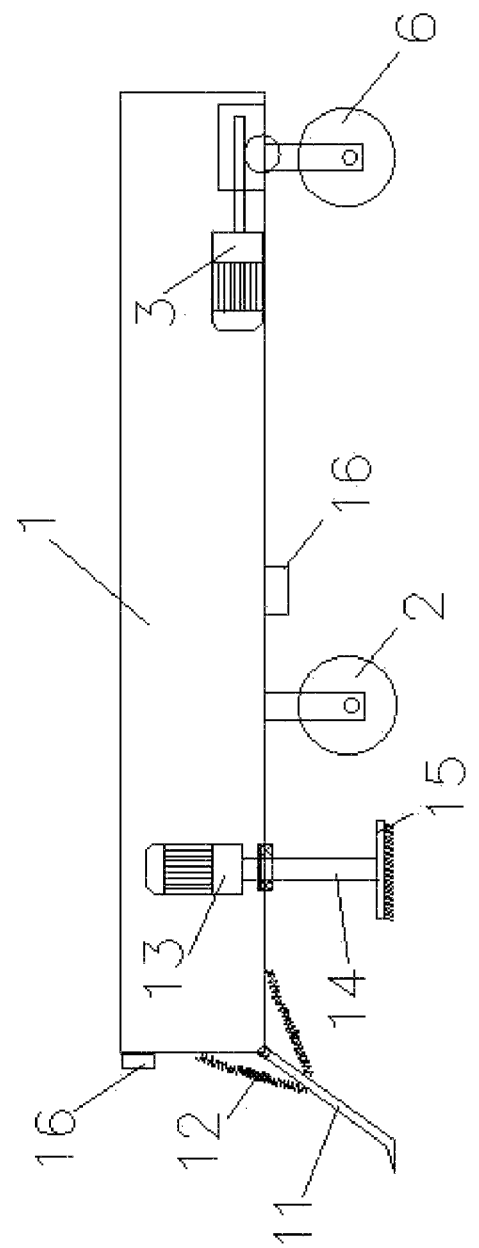
FIG. 1 is a schematic structural diagram of a gate detection robot based on a giant magnetoresistance element according to the present invention.

Drawings: support 1, guide wheel 2, first motor 3, housing 4, magnetic conductive connector 5, driving wheel 6, connecting bracket 7, magnetic concentrator 8, giant magnetic sensor 9, rotating shaft of worm gear 10, shovel plate 11, spring 12, second motor 13, rotary shaft 14, brush 15, ultrasonic sensor 16.

DETAILED DESCRIPTION

Further description of the present invention is provided below in conjunction with the specific embodiments.

Embodiment 1

Figure 2:
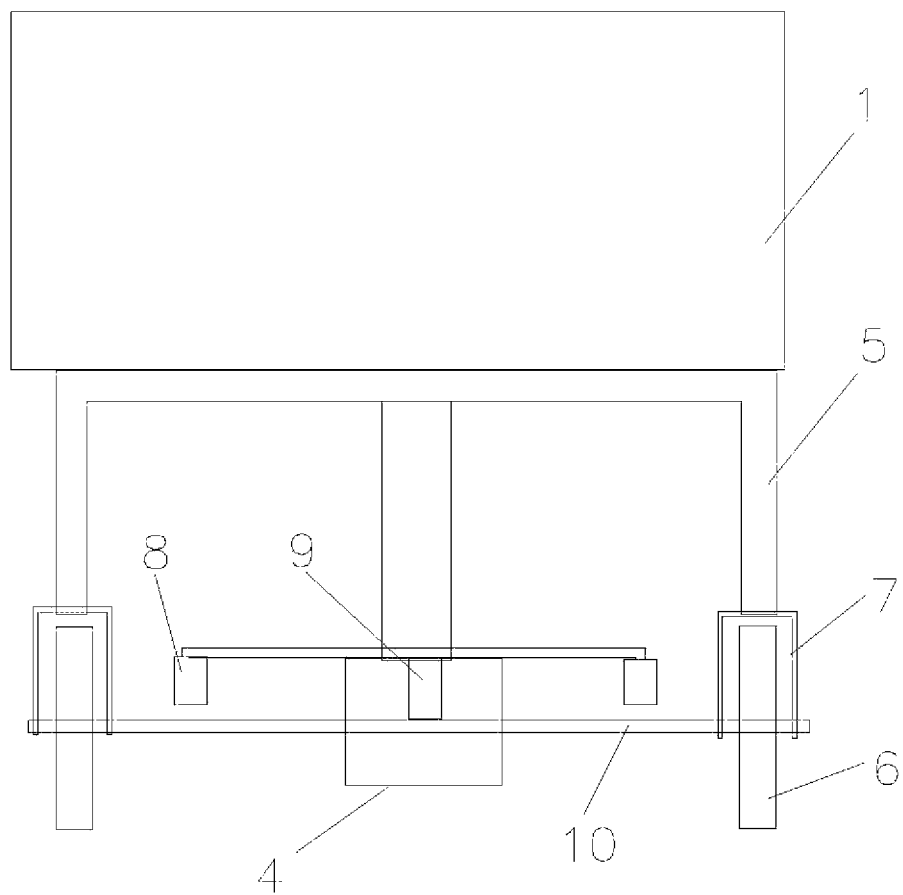
FIG. 2 is a right view of FIG. 1.
Figure 3:
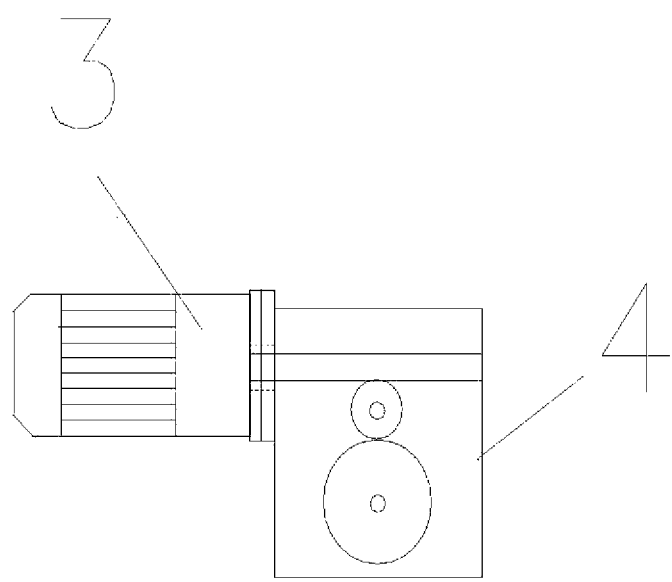
FIG. 3 is a schematic diagram of a second motor and a worm drive.

As shown in FIG. 1 to FIG. 3, a gate detection robot based on a giant magnetoresistance element includes an upper computer (not shown) and a detection mechanism, wherein the detection mechanism includes a support 1; a guide wheel 2 and two driving wheels 6 are provided at the bottom of the support; the support is provided with a controller (not shown), a range-based localization module, and a magnetic flaw detection sensor based on the giant magnetoresistance element.

The magnetic flaw detection sensor includes an excitation mechanism, a giant magnetic sensor 9, and two magnetic concentrators 8; the excitation mechanism includes an inverted U-shaped magnetic conductive connector 5 and two magnetizing exciters; the driving wheels 6 are made of a NdFeB permanent magnet and serve as the magnetizing exciters of the excitation mechanism; two ends of the magnetic conductive connector 5 are provided with the driving wheels as the magnetizing exciters through the connecting brackets 7, and the two magnetizing exciters form two magnetic poles of the excitation mechanism; the magnetic conductive connector 5 is fixedly connected to the upper ends of connecting brackets 7, and the lower ends of the connecting brackets 7 are rotatably connected to the driving wheels 6; the two driving wheels are driven by a first motor 3; the giant magnetic sensor 9 is located between the two magnetic concentrators 8.

The range-based localization module includes two ultrasonic sensors 16 provided at the bottom of the support, and the two ultrasonic sensors 16 are vertically provided, where one ultrasonic sensor is configured to measure the distance between the detection robot and one side of a gate, and the other ultrasonic sensor is configured to measure the distance between the detection robot and the bottom of the gate.

The first motor 3, the giant magnetic sensor 9, and the ultrasonic sensors 16 are electrically connected to the controller; the controller and the upper computer are connected through a cable and are in serial communication.

Waterproof treatment is performed on the detection robot.

The calculation module in the controller plans a detection walking route of the detection robot, and controls the robot to perform detection according to this route; during detection, the excitation mechanism magnetizes the gate with a magnetic field as a medium; when a surface of the gate has a defect, the magnetic conductivity of the local area is reduced and the magnetic resistance is increased so that magnetic lines are distorted and diffused outside the gate to form a detectable leakage magnetic field signal; the giant magnetic sensor consisting of giant magnetoresistance elements moves synchronously with the excitation mechanism, and an abnormal magnetoelectric signal is output and transmitted to the controller, so that the controller obtains a specific location of the detection robot, i.e., a specific location of the defect, according to data currently measured by the two ultrasonic sensors, and transmits defect information and defect location information to the upper computer.

The magnetic flaw detection sensor based on the giant magnetoresistance element, when a gate to be detected is located on a magnetic pole side of the excitation mechanism, uses a NdFeB permanent magnet as a magnetizing exciter to magnetize said gate. If the gate has no defect, the magnetic lines pass through the gate uniformly without magnetic leakage; if a defect exists inside the gate or on the surface of the gate, magnetic leakage is generated. The magnetic concentrators collect a leakage magnetic field spatially distributed and guide it into a detection path of the giant magnetoresistance element, and the giant magnetoresistance element converts a magnetic signal into an electrical signal and transmits it to the controller.

The detection robot is convenient to operate; the measured space discrimination and the coverage range are increased; the magnetic concentrators are added, the magnetic field is collected, guided and homogenized, the detection sensitivity is high, the detection result precision is high, a weak magnetic field can be measured, and the stability is good.

In this embodiment, the magnetic concentrators 8 are made of a NiFe alloy.

In this embodiment, the gate detection robot further includes a clearing mechanism, and the clearing mechanism includes a shovel plate 11 and a brush assembly, where the shovel plate 11 is obliquely provided at the front end of the support 1 and is configured to shovel sludge and mosses on the gate, thereby preventing the sludge and mosses from affecting the detection result.

The brush assembly includes the second motor 13, a rotary shaft 14, a rotary table, and a brush 15; the second motor 13 is fixedly provided on the support 1; the output shaft of the second motor 13 is connected to the rotary shaft 14 through a coupling, and the other end of the rotary shaft 14 is fixedly connected to the rotary table; the brush 15 is connected to the rotary table. The controller controls the second motor to drive the rotary table to rotate, so that the brush rotates along with the rotary table to brush the surface of the gate.

In this embodiment, the shovel plate 11 is hinged to the support 1, the upper surface of the shovel plate 11 is connected to one end of a spring 12, and the other end of each of the two springs is connected to the support. In a stretched state, the springs have a buffering function.

As shown in FIGS. 2 and 3, in this embodiment, the driving wheels 6 are driven by a worm gear which comprise a worm and a gear, and the worm gear is mounted in a housing 4; the housing 4 is fixed at the bottom of the support 1; the output shaft of the first motor 3 is connected to the worm through a coupling; two ends of the rotating shaft of the gear 10 extend out of the housing to be respectively connected to the corresponding driving wheels. The worm gear assembly is stable in operation and low in noise.

In this embodiment, the giant magnetic sensor 9 and the two magnetic concentrators 8 are mounted on the housing 4.

In this embodiment, the giant magnetic sensor 9 is formed by combining a plurality of giant magnetoresistance elements, and the giant magnetic sensor 9 is located between the two magnetic poles of the excitation mechanism.

Embodiment 2

A detection method of the gate detection robot based on the giant magnetoresistance element includes the following steps:

step 1. placing a robot at the vertex of the upper end of a gate to be detected; measuring the distance between the robot and the other side of the gate and the distance between the robot and the bottom of the gate through the two ultrasonic sensors, i.e., measuring the dimension of the whole gate; and sending the data to the controller, so that the calculation module in the controller establishes a rectangular coordinate system with the vertex as a coordinate origin, the width direction of the gate as an X-axis, and the height direction of the gate as a Y-axis;

step 2. planning, by the calculation module in the controller, a detection walking route of the detection robot, and controlling the robot to perform detection according to this route; during detection, magnetizing, by the excitation mechanism, the gate with a magnetic field as a medium; when a surface of the gate has a defect, the magnetic conductivity of the local area being reduced and the magnetic resistance being increased so that magnetic lines are distorted and diffused outside the gate to form a detectable leakage magnetic field signal; and enabling the giant magnetic sensor consisting of giant magnetoresistance elements to move synchronously with the excitation mechanism, and outputting an abnormal magnetoelectric signal and transmitting the signal to the controller, so that the controller obtains a specific location of the detection robot, i.e., a specific location of the defect, according to data currently measured by the two ultrasonic sensors, and transmits defect information and defect location information to the upper computer.

In this embodiment, during the walking process of the robot along the surface of the gate, the shovel plate shovels sludge and mosses on the surface of the gate, the controller controls the second motor to drive the rotary table to rotate, so that the brush rotates along with the rotary table to brush the surface of the gate.

In this embodiment, at step 2, the robot is controlled to perform detection according to a set route, and the route is set as moving upwards layer by layer along the height direction of the gate.

The terms based on the orientation or positional relationships showing in the drawings should be understood as "central", "longitudinal", "transversal", "front", "back", "left", "right", "vertical", "horizontal", "top", "bottom", "inner", "outer", etc. It is more convenient to describe the present invention and to simplify the description, instead of indicating or implying the devices or elements with the specific orientations, structure and operation, which can not define a limitation of protection of the present invention.

The foregoing are merely preferred embodiments of the present invention. It should be noted that a person skilled in the art can further make various modifications and variations without departing from the technical principles of the present invention, and these modifications and variations also should be considered to be within the scope of protection of the present invention.

What is claimed is:

1. A gate detection robot based on a giant magnetoresistance element, comprising
    a detection mechanism which comprises a support, wherein,
    a guide wheel and two driving wheels are provided at a bottom of the support,
    a magnetic flaw detection sensor based on the giant magnetoresistance element is provided on the support and comprises an excitation mechanism, a giant magnetic sensor, and two magnetic concentrators, the excitation mechanism comprises an inverted U-shaped magnetic conductive connector and two magnetizing exciters which are the two driving wheels, the driving wheels are made of NdFeB permanent magnet and serve as the magnetizing exciters of the excitation mechanism, two ends of the magnetic conductive connector are respectively provided with the driving wheels which are the magnetizing exciters, and the two magnetizing exciters form two magnetic poles of the excitation mechanism, the two driving wheels are driven by a first motor, the giant magnetic sensor is located between the two magnetic concentrators;
    a range-based localization module is provided on the support and comprises two ultrasonic sensors, and the two ultrasonic sensors are vertically provided, one ultrasonic sensor is provided at one end of the support and configured to measure a distance between the detection robot and one side of a gate, and other ultrasonic sensor is provided at the bottom of the support and configured to measure a distance between the detection robot and a bottom of the gate;
    the first motor, the giant magnetic sensor and the ultrasonic sensor are all in signal connection with a controller.

2. The gate detection robot based on the giant magnetoresistance element according to claim 1,
    the controller is connected and an upper computer through a cable and being in serial communication.

3. The gate detection robot based on the giant magnetoresistance element according to claim 1, further comprising connecting brackets and a rotating shaft, wherein,
    the two ends of the magnetic conductive connector are connected to the driving wheels as the magnetizing exciters through the connecting brackets, the two driving wheels are connected through the rotating shaft, upper ends of the connecting brackets are fixedly connected to the magnetic conductive connector, and lower ends of the connecting brackets are rotatably connected to the rotating shaft of the driving wheels.

4. The gate detection robot based on the giant magnetoresistance element according to claim 1, wherein,
    the magnetic concentrators are made of a NiFe alloy.

5. The gate detection robot based on the giant magnetoresistance element according to claim 1, wherein,
    the giant magnetic sensor is formed by a plurality of giant magnetoresistance elements, and the giant magnetic sensor is located between the two magnetic poles of the excitation mechanism.

6. A detection method of the gate detection robot based on the giant magnetoresistance element according to claim 1, comprising the following steps:
    placing a robot at a vertex of an upper end of a gate to be detected at one side of the gate, measuring a distance between the robot and other side of the gate and a distance between the robot and a bottom of the gate through the two ultrasonic sensors, that is measuring a dimension of the whole gate, and sending data to the controller so that a calculation module in the controller establishes a rectangular coordinate system with the vertex as a coordinate origin, a width direction of the gate as an X-axis, and a height direction of the gate as a Y-axis;
    planning a detection walking route of the detection robot by the calculation module in the controller, and controlling the robot to perform detection according to this route, during detection, magnetizing, by the excitation mechanism, the gate with a magnetic field as a medium, when a surface of the gate has a defect, a magnetic conductivity of a local area is reduced and the magnetic resistance is increased so that magnetic lines are distorted and diffused outside the gate to form a detectable leakage magnetic field signal and enabling the giant magnetic sensor to move synchronously with the excitation mechanism, and transmitting the signal to the controller, so that the controller obtains a specific location of the detection robot, which is a specific location of the defect, according to data currently measured by the two ultrasonic sensors, and transmits defect information and defect location information to the upper computer.

7. The gate detection robot based on the giant magnetoresistance element according to claim 1, wherein,
    the driving wheels are driven by a worm gear which comprises a worm and a gear, and the worm gear is mounted in a housing, the housing is fixed at the bottom of the support, an output shaft of the first motor is connected to the worm through a coupling, two ends of the rotating shaft of the gear extend out of the housing to be respectively connected to the corresponding driving wheels.

8. The gate detection robot based on the giant magnetoresistance element according to claim 7, wherein,
the giant magnetic sensor and the two magnetic concentrators are mounted on the housing.

9. The gate detection robot based on the giant magnetoresistance element according to claim 1, further comprising a clearing mechanism, the clearing mechanism comprising a shovel plate and a brush assembly, wherein the shovel plate is obliquely provided at a front end of the support and is configured to shovel sludge and mosses on the gate; and
the brush assembly comprises a second motor, a rotary shaft, a rotary table, and a brush, the second motor is fixedly provided on the support, an output shaft of the second motor is connected to the rotary shaft through a coupling, other end of the rotary shaft is fixedly connected to the rotary table, and the brush is connected to the rotary table.

10. The gate detection robot based on the giant magnetoresistance element according to claim 9, wherein,
the shovel plate is hinged to the support, an upper surface of the shovel plate is connected to one end of a spring, a lower surface of the shovel plate is connected to one end of another spring, and other end of each of the two springs is connected to the support.

\* \* \* \* \*